(12) United States Patent
Cloutier et al.

(10) Patent No.: US 9,314,999 B2
(45) Date of Patent: *Apr. 19, 2016

(54) BIAXIALLY ORIENTED POLYLACTIC ACID FILM WITH HIGH BARRIER

(75) Inventors: Joshua R. Cloutier, Coventry, RI (US); Takeshi Mizumura, East Greenwich, RI (US); Keunsuk P. Chang, North Kingstown, RI (US)

(73) Assignee: TORAY PLASTICS (AMERICA), INC., N. Kingstown, RI (US)

( * ) Notice: Subject to any disclaimer, the term of this patent is extended or adjusted under 35 U.S.C. 154(b) by 91 days.

This patent is subject to a terminal disclaimer.

(21) Appl. No.: 12/542,428

(22) Filed: Aug. 17, 2009

(65) Prior Publication Data

US 2010/0040904 A1    Feb. 18, 2010

Related U.S. Application Data

(60) Provisional application No. 61/089,128, filed on Aug. 15, 2008.

(51) Int. Cl.
| | |
|---|---|
| *B32B 27/36* | (2006.01) |
| *B32B 27/08* | (2006.01) |
| *C23C 14/02* | (2006.01) |
| *C23C 14/14* | (2006.01) |
| *C23C 14/24* | (2006.01) |
| *C23C 14/34* | (2006.01) |
| *C23C 28/00* | (2006.01) |
| *B32B 27/30* | (2006.01) |

(52) U.S. Cl.
CPC ............. *B32B 27/08* (2013.01); *B32B 27/308* (2013.01); *B32B 27/36* (2013.01); *C23C 14/024* (2013.01); *C23C 14/14* (2013.01); *C23C 14/24* (2013.01); *C23C 14/34* (2013.01); *C23C 28/00* (2013.01); *B32B 2255/10* (2013.01); *B32B 2255/205* (2013.01); *B32B 2255/28* (2013.01); *B32B 2270/00* (2013.01); *B32B 2307/31* (2013.01); *B32B 2307/518* (2013.01); *B32B 2307/702* (2013.01); *B32B 2307/704* (2013.01); *B32B 2307/716* (2013.01); *B32B 2307/7242* (2013.01); *B32B 2307/7244* (2013.01); *B32B 2307/7246* (2013.01); *B32B 2439/70* (2013.01); *B32B 2451/00* (2013.01); *B32B 2519/00* (2013.01); *Y10T 428/12569* (2015.01)

(58) Field of Classification Search
None
See application file for complete search history.

(56) References Cited

U.S. PATENT DOCUMENTS

| | | | |
|---|---|---|---|
| 4,189,419 A | 2/1980 | Takemoto et al. | |
| 4,281,045 A | 7/1981 | Sumi et al. | |
| 4,310,578 A | 1/1982 | Katsura et al. | |
| 4,379,914 A | 4/1983 | Lundberg | |
| 4,410,595 A | 10/1983 | Matsumoto et al. | |
| 4,464,438 A | 8/1984 | Lu | |
| 4,632,959 A | 12/1986 | Nagano | |
| 4,745,171 A | 5/1988 | Sato et al. | |
| 4,828,920 A | 5/1989 | Nakabayashi et al. | |
| 4,877,685 A | 10/1989 | Bergstrom et al. | |
| 5,084,334 A | 1/1992 | Hamano et al. | |
| 5,108,807 A | 4/1992 | Tucker | |
| 5,147,726 A | 9/1992 | Suzuki et al. | |
| 5,153,074 A | 10/1992 | Migliorini | |
| 5,155,160 A | 10/1992 | Yeh et al. | |
| 5,175,054 A | 12/1992 | Chu | |
| 5,192,620 A | 3/1993 | Chu et al. | |
| 5,216,050 A | 6/1993 | Sinclair | |
| 5,352,716 A | 10/1994 | Chapman et al. | |
| 5,359,026 A | 10/1994 | Gruber | |
| 5,391,423 A | 2/1995 | Wnuk et al. | |
| 5,443,780 A | 8/1995 | Matsumoto et al. | |
| 5,444,107 A | 8/1995 | Ajioka et al. | |
| 5,473,439 A | 12/1995 | Pappas | |
| 5,484,881 A | 1/1996 | Gruber et al. | |
| 5,489,474 A | 2/1996 | Shinoda et al. | |
| 5,556,711 A | 9/1996 | Ajioka et al. | |
| 5,585,191 A | 12/1996 | Gruber et al. | |
| 5,631,066 A | 5/1997 | O'Brien | |
| 5,631,498 A * | 5/1997 | Anschel et al. | ............... 257/690 |
| 5,731,093 A | 3/1998 | Chang et al. | |
| 5,849,374 A | 12/1998 | Gruber et al. | |
| 5,849,401 A | 12/1998 | El-Afandi et al. | |
| 5,908,918 A | 6/1999 | Chen et al. | |
| 5,939,467 A | 8/1999 | Wnuk et al. | |
| 6,005,068 A | 12/1999 | Gruber et al. | |
| 6,033,747 A | 3/2000 | Shiotani | |
| 6,080,478 A | 6/2000 | Karhuketo | |
| 6,096,431 A | 8/2000 | Matsudaira et al. | |
| 6,106,950 A | 8/2000 | Searle et al. | |
| 6,121,410 A | 9/2000 | Gruber et al. | |
| 6,143,408 A | 11/2000 | Fujita | |
| 6,153,276 A | 11/2000 | Oya et al. | |
| 6,171,714 B1 * | 1/2001 | Bergkessel et al. | ........... 428/618 |
| 6,211,290 B1 | 4/2001 | Xiao et al. | |
| 6,248,430 B1 | 6/2001 | Toyoda et al. | |

(Continued)

FOREIGN PATENT DOCUMENTS

| | | |
|---|---|---|
| CA | 2239671 | 12/1999 |
| DE | 43 13 136 | 10/1994 |

(Continued)

OTHER PUBLICATIONS

English Machine Translation of JP2007-269995A, Translated Sep. 12, 2011.*

(Continued)

*Primary Examiner* — Adam Krupicka
(74) *Attorney, Agent, or Firm* — Morrison & Foerster LLP

(57) ABSTRACT

A multilayer film including a first layer including a polylactic acid polymer, a second layer of a metal primer, deposited upon one surface of the first polylactic acid polymer layer, and a third metal layer deposited on the second metal primer layer. This metal-primed and metallized polylactic acid film exhibits improved moisture barrier properties versus a non-metal-primed and metallized polylactic acid film and can be used as part of a lamination structure for food packaging applications.

17 Claims, No Drawings

(56) References Cited

U.S. PATENT DOCUMENTS

| | | |
|---|---|---|
| 6,312,823 B1 | 11/2001 | El-Afandi et al. |
| 6,322,899 B1 | 11/2001 | Karhuketo et al. |
| 6,326,440 B1 | 12/2001 | Terada et al. |
| 6,350,530 B1 | 2/2002 | Morikawa et al. |
| 6,353,086 B1 | 3/2002 | Kolstad et al. |
| 6,444,750 B1 | 9/2002 | Touhsaent |
| 6,472,081 B1 | 10/2002 | Tsai et al. |
| 6,500,556 B1 | 12/2002 | Morris et al. |
| 6,514,602 B1 | 2/2003 | Zhao et al. |
| 6,521,336 B2 | 2/2003 | Narita et al. |
| 6,543,208 B1 | 4/2003 | Kobayashi et al. |
| 6,544,369 B1 | 4/2003 | Kitamura et al. |
| 6,566,426 B1 | 5/2003 | Kanaida et al. |
| 6,600,008 B1 | 7/2003 | Kobayashi et al. |
| 6,649,103 B1 | 11/2003 | Bousmina et al. |
| 6,649,732 B2 | 11/2003 | Kobayashi et al. |
| 6,713,175 B1 | 3/2004 | Terada et al. |
| 6,787,245 B1 | 9/2004 | Hayes |
| 6,808,795 B2 | 10/2004 | Noda et al. |
| 6,821,373 B1 | 11/2004 | Berlin et al. |
| 6,841,597 B2 | 1/2005 | Bastioli et al. |
| 6,844,077 B2 | 1/2005 | Squier et al. |
| 7,067,596 B2 | 6/2006 | Bastioli et al. |
| 7,070,803 B2 | 7/2006 | Skinhoj et al. |
| 7,087,313 B2 | 8/2006 | Sawai et al. |
| 7,112,356 B2 | 9/2006 | Nomula et al. |
| 7,128,969 B2 | 10/2006 | Busch et al. |
| 7,173,080 B2 | 2/2007 | Yamada et al. |
| 7,175,917 B2 | 2/2007 | Sukigara et al. |
| 7,195,822 B2 | 3/2007 | Hiruma |
| 7,214,414 B2 | 5/2007 | Khemani et al. |
| 7,223,359 B2 | 5/2007 | Torkelson et al. |
| 7,235,287 B2 | 6/2007 | Egawa |
| 7,285,318 B2 | 10/2007 | Kaku et al. |
| 7,316,848 B2 | 1/2008 | Longmoore |
| 7,320,773 B2 | 1/2008 | Egawa |
| 7,351,772 B2 | 4/2008 | Yano et al. |
| 7,351,785 B2 | 4/2008 | Matsumoto et al. |
| 7,354,973 B2 | 4/2008 | Flexman |
| 7,368,160 B2 | 5/2008 | Inglis |
| 7,368,496 B2 | 5/2008 | Kim et al. |
| 7,390,543 B2 | 6/2008 | Itoh et al. |
| 7,390,558 B2 | 6/2008 | Aritake et al. |
| 7,449,510 B2 | 11/2008 | Ueda et al. |
| 7,452,927 B2 | 11/2008 | Hayes |
| 7,491,359 B2 | 2/2009 | Bourgeois |
| 7,501,176 B2 | 3/2009 | Yamasaki et al. |
| 7,521,103 B2 | 4/2009 | Posey |
| 7,566,753 B2 | 7/2009 | Randall et al. |
| 7,589,151 B2 | 9/2009 | Aoki et al. |
| 7,619,025 B2 | 11/2009 | Mohanty et al. |
| 7,678,444 B2 | 3/2010 | Tedford, Jr. et al. |
| 7,713,636 B2 | 5/2010 | Song et al. |
| 7,714,048 B2 | 5/2010 | Goino et al. |
| 7,786,210 B2 | 8/2010 | Uradnisheck et al. |
| 7,799,399 B2 | 9/2010 | Sargeant et al. |
| 7,820,276 B2 | 10/2010 | Sukigara et al. |
| 7,834,092 B2 | 11/2010 | Uradnisheck et al. |
| 7,847,184 B2 | 12/2010 | Hayes et al. |
| 7,854,994 B2 | 12/2010 | Henderson-Rutgers et al. |
| 7,943,218 B2 | 5/2011 | Knoerzer et al. |
| 7,951,438 B2 | 5/2011 | Lee et al. |
| 7,993,745 B2 | 8/2011 | Narita et al. |
| 8,003,731 B2 | 8/2011 | Seeliger et al. |
| 8,043,674 B2 | 10/2011 | Rehkugler et al. |
| 8,053,219 B2 | 11/2011 | Kang et al. |
| 8,062,721 B2 | 11/2011 | Kawahara et al. |
| 8,080,297 B2 | 12/2011 | Kravitz et al. |
| 8,252,421 B2 | 8/2012 | Arai et al. |
| 8,450,420 B2 | 5/2013 | Sakurai |
| 2001/0031348 A1 | 10/2001 | Jud et al. |
| 2002/0006485 A1 | 1/2002 | Bening et al. |
| 2002/0028857 A1 | 3/2002 | Holy |
| 2002/0076554 A1 | 6/2002 | Stopper |
| 2002/0086940 A1 | 7/2002 | Ota et al. |
| 2002/0094444 A1 | 7/2002 | Nakata et al. |
| 2002/0127358 A1 | 9/2002 | Berlin et al. |
| 2003/0039775 A1 | 2/2003 | Kong |
| 2003/0175545 A1* | 9/2003 | Kastner et al. ............... 428/626 |
| 2003/0199218 A1 | 10/2003 | Mueller et al. |
| 2004/0053064 A1* | 3/2004 | Masuda et al. ............... 428/500 |
| 2004/0096677 A1 | 5/2004 | Imai et al. |
| 2004/0185282 A1* | 9/2004 | Rosenbaum et al. ......... 428/480 |
| 2004/0191541 A1 | 9/2004 | Squier et al. |
| 2004/0258857 A1 | 12/2004 | Dagan et al. |
| 2005/0098928 A1 | 5/2005 | Rosenbaum et al. |
| 2005/0131120 A1 | 6/2005 | Flexman |
| 2005/0186414 A1 | 8/2005 | Su et al. |
| 2005/0250931 A1 | 11/2005 | Takagi |
| 2005/0287358 A1 | 12/2005 | Inglis |
| 2006/0009611 A1 | 1/2006 | Hayes |
| 2006/0019111 A1 | 1/2006 | Sawai et al. |
| 2006/0068200 A1 | 3/2006 | Cleckner et al. |
| 2006/0116471 A1 | 6/2006 | Aoyama et al. |
| 2006/0135668 A1 | 6/2006 | Hayes |
| 2006/0257585 A1 | 11/2006 | Schiller et al. |
| 2006/0257676 A1 | 11/2006 | Itada et al. |
| 2006/0269755 A1 | 11/2006 | Song |
| 2007/0020448 A1 | 1/2007 | Hubbard et al. |
| 2007/0032577 A1 | 2/2007 | Kanzawa et al. |
| 2007/0036923 A1 | 2/2007 | Ishizaki et al. |
| 2007/0054070 A1 | 3/2007 | Laney et al. |
| 2007/0087131 A1 | 4/2007 | Hutchinson et al. |
| 2007/0098966 A1 | 5/2007 | Zhou |
| 2007/0141372 A1 | 6/2007 | Su et al. |
| 2007/0179218 A1 | 8/2007 | Brake et al. |
| 2007/0182041 A1 | 8/2007 | Rizk et al. |
| 2007/0254160 A1 | 11/2007 | Kravitz et al. |
| 2007/0259139 A1 | 11/2007 | Furneaux |
| 2008/0027178 A1 | 1/2008 | Uradnisheck |
| 2008/0160327 A1 | 7/2008 | Knoerzer et al. |
| 2008/0188154 A1 | 8/2008 | Leis et al. |
| 2008/0311813 A1 | 12/2008 | Ting et al. |
| 2009/0022919 A1 | 1/2009 | Chicarella et al. |
| 2009/0053489 A1 | 2/2009 | Yamamura et al. |
| 2009/0098375 A1 | 4/2009 | Voisin et al. |
| 2009/0098395 A1 | 4/2009 | Lu |
| 2009/0148713 A1 | 6/2009 | Lee et al. |
| 2009/0148715 A1 | 6/2009 | Lee |
| 2009/0169844 A1 | 7/2009 | Yamamura et al. |
| 2009/0171065 A1 | 7/2009 | Nakamura et al. |
| 2009/0263600 A1 | 10/2009 | Miyashita et al. |
| 2009/0263654 A1 | 10/2009 | Arai et al. |
| 2009/0286090 A1 | 11/2009 | Ting et al. |
| 2009/0311544 A1 | 12/2009 | Lee et al. |
| 2009/0312462 A1 | 12/2009 | Oakley et al. |
| 2010/0009208 A1 | 1/2010 | Lee |
| 2010/0092791 A1 | 4/2010 | Busch et al. |
| 2010/0151167 A1 | 6/2010 | Gohil |
| 2010/0247886 A1 | 9/2010 | Lee et al. |
| 2011/0028622 A1 | 2/2011 | Uradnisheck |
| 2011/0046254 A1 | 2/2011 | Shin et al. |
| 2011/0052867 A1 | 3/2011 | Yamamura et al. |
| 2011/0171489 A1 | 7/2011 | Dou et al. |
| 2011/0244185 A1 | 10/2011 | Dou et al. |
| 2011/0244186 A1 | 10/2011 | Dou et al. |
| 2011/0244257 A1 | 10/2011 | Paulino et al. |
| 2012/0088108 A1 | 4/2012 | Paolilli et al. |
| 2012/0141766 A1 | 6/2012 | Paulino et al. |
| 2013/0143057 A1 | 6/2013 | Paolilli et al. |
| 2013/0143064 A1 | 6/2013 | Paolilli et al. |

FOREIGN PATENT DOCUMENTS

| | | |
|---|---|---|
| EP | 1385700 | 7/2005 |
| EP | 1 619 021 | 1/2006 |
| EP | 1385899 | 2/2007 |
| EP | 1 839 849 | 10/2007 |
| EP | 1 942 001 | 7/2008 |
| EP | 1 955 845 | 8/2008 |
| EP | 2065178 A1 | 6/2009 |
| EP | 2 133 382 | 12/2009 |
| JP | 8-176329 | 7/1996 |
| JP | 2002-155207 | 5/2002 |

(56) References Cited

FOREIGN PATENT DOCUMENTS

| | | |
|---|---|---|
| JP | 2003-145677 | 5/2003 |
| JP | 2003-170560 | 6/2003 |
| JP | 2003-276144 | 9/2003 |
| JP | 2004-82512 | 3/2004 |
| JP | 2004-315586 | 11/2004 |
| JP | 2004-323592 | 11/2004 |
| JP | 2004-358721 | 12/2004 |
| JP | 2006-176758 | 7/2006 |
| JP | 2006-263892 | 10/2006 |
| JP | 2007-076192 | 3/2007 |
| JP | 2007-99952 | 4/2007 |
| JP | 2007269995 A * | 10/2007 |
| JP | 2008-62591 | 3/2008 |
| JP | 2008-62984 | 3/2008 |
| KR | 10-2006-0099887 | 9/2006 |
| KR | 10-2007-0102005 | 10/2007 |
| WO | WO-94/17220 | 8/1994 |
| WO | WO-02/087877 | 11/2002 |
| WO | WO-02/088230 | 11/2002 |
| WO | WO-2004/016417 A2 | 2/2004 |
| WO | WO-2004/060648 | 7/2004 |
| WO | WO-2004/087812 | 10/2004 |
| WO | WO-2004/094143 | 11/2004 |
| WO | WO-2004/101642 | 11/2004 |
| WO | WO-2005/053964 | 6/2005 |
| WO | WO-2005/059031 | 6/2005 |
| WO | WO-2007/046174 | 4/2007 |
| WO | WO-2007/118280 | 10/2007 |
| WO | WO-2008/020726 | 2/2008 |
| WO | WO-2008/035557 | 3/2008 |
| WO | WO-2009/076458 | 6/2009 |
| WO | WO-2009/076541 | 6/2009 |
| WO | WO-2009/084518 | 7/2009 |
| WO | WO-2009/142825 | 11/2009 |
| WO | WO-2009/152427 | 12/2009 |
| WO | WO-2009-524460 | 12/2009 |
| WO | WO-2010/019944 | 2/2010 |

OTHER PUBLICATIONS

International Search Report and Written Opinion mailed Feb. 11, 2011, directed to International Patent Application No. PCT/US10/50227; 10 pages.

International Search Report and Written Opinion mailed Mar. 14, 2011, directed to International Patent Application No. PCT/US10/62062; 10 pages.

Dou, S. et al., U.S. Appl. No. 13/077,302, filed Mar. 31, 2011; 65 pages.

Lee et al., U.S. Office Action mailed on Apr. 12, 2010, directed at U.S. Appl. No. 12/332,153; 11 pages.

Jiang, L. et al. (2006). "Study of Biodegradable Polylactide/Poly(butylene adipate-coterephthalate) Blends." *Biomacromolecules.* 7(1):199-207.

International Search Report and Written Opinion mailed on Aug. 17, 2010, directed to counterpart International Patent Application No. PCT/US10/38848; 11 pages.

International Search Report and Written Opinion mailed on Sep. 1, 2010, directed to counterpart International Patent Application No. PCT/US2010/040185; 10 pages.

Lee et al., U.S. Office Action mailed on Sep. 28, 2010, directed at U.S. Appl. No. 12/332,153; 9 pages.

Shichen Dou et al., U.S. Appl. No. 12/814,802, filed Jun. 14, 2010; 35 pages.

Shichen Dou et al., U.S. Appl. No. 12/824,759, filed Jun. 28, 2010; 30 pages.

Tracy A. Paolilli et al., U.S. Appl. No. 12/890,349, filed Sep. 24, 2010; 50 pages.

Shichin Dou et al., U.S. Appl. No. 61/218,846, filed Jun. 19, 2009; 13 pages.

Defosse, Matt. "Film extrusion: Bioplastic barrier film matches EVOH, PA," located at <http://www.plasticstoday.com/print/31263> visited on Nov. 20, 2009. (1 page).

"Coextruded Film Structures of PLA and EVOH," presented at Tappi Place Conference, Albuquerque, New Mexico, Apr. 18-21, 2010; 31 pages.

Shichen Dou et al., U.S. Appl. No. 13/030,392, filed Feb. 18, 2011; 63 pages.

International Search Report and Written Opinion mailed Jun. 3, 2011, directed to International Patent Application No. PCT/US11/25466; 10 pages.

International Search Report and Written Opinion mailed May 26, 2011, directed to International Patent Application No. PCT/US11/30784; 9 pages.

Biofilm S.A. "Prospect on PLA applications: Clear Barrier Technology" promotional literature presented at "Innovation Takes Root" by Nature Works, Las Vegas NV. Sep. 16-18, 2008; 16 pages.

TAPPI Conference Presentation, May 2003, "Adhesive Properties of Ethylene-Acrylic Ester-Maleic Anhydride Terpolymers in Extrusion Coating/Lamination"; (27 pages).

Product Literature Presentation, May 2005, "Lotader: Ultra Versatile Adhesives for Extrusion Coating and Extrusion Lamination Technologies"; (18 pages).

International Search Report and Written Opinion mailed on Feb. 6, 2009, directed to counterpart international Application No. PCT/US2008/86261; 8 pages.

International Search Report and Written Opinion mailed on Feb. 6, 2009, directed to counterpart International Patent Application No. PCT/US2008/86450; 5 pages.

Lee et al., U.S. Office Action mailed Jun. 25, 2009, directed to U.S. Appl. No. 12/332,153; 9 pages.

International Search Report mailed on Oct. 1, 2009 directed at international application No. PCT/US2009/054022; 12 pages.

Lee et al., U.S Office Action mailed on Dec. 23, 2009 directed at U.S. Appl. No. 12/332,153; 10 pages.

(2007) "Technology Focus Report: Toughened PLA," NatureWorks 1-5.

Priddy D. (2010). "Improving PLA mechanical properties by the addition of oil," Polymer Engineering and Science 50(3): 513-519.

Shichen Dou et al., U.S. Appl. No. 12/977,647, filed on Dec. 23, 2010; 59 pages.

International Search Report and Written Opinion, mailed Aug. 17, 2011, directed to International Patent Application No. PCT/US11/36453; 11 pages.

Wallach, J. et al., "Methacrylic Group Functionalized Poly(lactic acid) Macromonomers from Chemical Recycling of Poly(lactic acid)." *Polymers from Renewable Resources*, ACS Symposium Series [online]. Jan. 15, 2001. Chapter 18, pp. 281-292: Retrieved from the Internet: URL:http://pubs.acs.org/doi/abs/10.1021/bk-2000-0764.ch018, Abstract only.

Extended Search Report dated Nov. 6, 2012, directed to EP Application No. 08859113.6; 6 pages.

Dou et al., U.S. Office Action mailed Apr. 24, 2013, directed to U.S. Appl. No. 13/030,392; 12 pages.

Lee, U.S. Office Action mailed May 25, 2012, directed to U.S. Appl. No. 12/333,047; 9 pages.

Dou et al., U.S. Office Action mailed Aug. 7, 2012, directed to U.S. Appl. No. 12/814,802; 19 pages.

Dou, et al., U.S. Office Action mailed Jun. 29, 2012, directed to U.S. Appl. No. 12/977,647; 21 pages.

Dou et al., U.S. Office Action mailed Aug. 20, 2012, directed to U.S. Appl. No. 12/824,759; 12 pages.

Dou et al., U.S. Office Action mailed Sep. 7, 2012, directed to U.S. Appl. No. 13/077,302; 12 pages.

Dou et al., U.S. Office Action mailed Dec. 12, 2012, directed to U.S. Appl. No. 12/977,647; 12 pages.

Paulino et al., U.S. Office Action mailed Dec. 26, 2012, directed to U.S. Appl. No. 13/107,149; 15 pages.

Paolilli et al., U.S. Office Action mailed Jan. 16, 2013, directed to U.S. Appl. No. 12/890,349; 11 pages.

Dou et al., U.S. Office Action mailed Jan. 18, 2013, directed to U.S. Appl. No. 12/814,802; 15 pages.

Dou et al., U.S. Office Action mailed Jan. 22, 2013, directed to U.S. Appl. No. 12/824,759; 9 pages.

Dou et al., U.S. Office Action mailed Feb. 14, 2013, directed to U.S. Appl. No. 13/077,302; 13 pages.

(56) References Cited

OTHER PUBLICATIONS

Markarian, Jennifer. (May/Jun. 2008). "Biopolymers present new market opportunities for additives in packaging," *Plastics, Additives, and Compounding* 10(3): 22-25.

Paulino et al., U.S. Office Action mailed Aug. 5, 2013, directed to U.S. Appl. No. 13/107,149; 20 pages.

Paolilli et al., U.S. Office Action mailed Jul. 17, 2013, directed to U.S. Appl. No. 12/890,349; 12 pages.

Paolilli et al., U.S. Office Action mailed Sep. 3, 2013, directed to U.S. Appl. No. 13/754,476; 8 pages.

Dou et al., U.S. Office Action mailed Sep. 24, 2013, directed to U.S. Appl. No. 13/030,392; 9 pages.

Lee et al., Office Action mailed Sep. 20, 2012, directed to U.S. Appl. No. 12/731,925; 18 pages.

Lee et al., Office Action mailed Jun. 4, 2013, directed to U.S. Appl. No. 12/731,925; 18 pages.

Lee, U.S. Office Action mailed Mar. 27, 2014, directed to U.S. Appl. No. 12/333,047; 14 pages.

Dou et al., U.S. Office Action mailed Mar. 27, 2014, directed to U.S. Appl. No. 12/814,802; 14 pages.

Paolilli et al., U.S. Office Action mailed Apr. 9, 2014, directed to U.S. Appl. No. 12/890,349; 12 pages.

Dou et al., U.S. Office Action mailed Jun. 17, 2014, directed to U.S. Appl. No. 13/077,302; 12 pages.

Paulino et al., U.S. Office Action mailed May 22, 2013, directed to U.S. Appl. No. 13/313,567; 9 pages.

Paulino et al., U.S. Office Action mailed Oct. 16, 2013, directed to U.S. Appl. No. 13/313,567; 8 pages.

Paulino et al., U.S. Office Action mailed Feb. 26, 2014, directed to U.S. Appl. No. 13/313,567; 15 pages.

Extended Search Report dated Nov. 14, 2012, directed to EP Application No. 08860690.0; 6 pages.

Extended Search Report dated Nov. 21, 2012, directed to EP Application No. 09807412.3; 6 pages.

International Search Report and Written Opinion mailed May 7, 2010, directed to International Application No. PCT/US10/028685; 8 pages.

Extended Search Report dated May 3, 2013, directed to EP Application No. 10756851.1; 5 pages.

Canadian Office Action mailed Apr. 16, 2013, directed to CA Application 2,766,816; 2 pages.

Paolilli et al., U.S. Office Action mailed Oct. 10, 2013, directed to U.S. Appl. No. 13/754,215; 10 pages.

Paulino et al., U.S. Office Action mailed Oct. 23, 2014, directed to U.S. Appl. No. 13/313,567; 12 pages.

Dou et al., U.S. Office Action mailed Nov. 5, 2014, directed to U.S. Appl. No. 12/977,647; 12 pages.

Dou et al., U.S. Office Action mailed Nov. 6, 2014, directed to U.S. Appl. No. 13/077,302; 11 pages.

Office Action dated Jul. 7, 2014, directed to MX Application No. MX/a/2011/001623; 7 pages.

Dou et al., U.S. Office Action mailed Aug. 13, 2014, directed to U.S. Appl. No. 13/030,392; 12 pages.

Paolilli et al. U.S. Office Action mailed Oct. 8, 2014, directed to U.S. Appl. No. 12/890,349; 16 pages.

Dou et al., U.S. Office Action mailed Dec. 17, 2014, directed to U.S. Appl. No. 12/814,802; 21 pages.

Paulino et al., U.S. Office Action mailed Jan. 23, 2015, directed to U.S. Appl. No. 13/107,149; 26 pages.

Dou et al., U.S. Office Action mailed Mar. 12, 2015, directed to U.S. Appl. No. 13/030,392; 8 pages.

Dou et al., U.S. Office Action mailed May 20, 2015, directed to U.S. Appl. No. 12/977,647; 12 pages.

Paulino et al., U.S. Office Action mailed May 21, 2015, directed to U.S. Appl. No. 13/313,567; 15 pages.

Dou et al., U.S. Office Action mailed May 22, 2015, directed to U.S. Appl. No. 13/077,302; 12 pages.

Supplementary European Search Report mailed Jul. 24, 2015, directed to EP Application No. 10819546.2; 7 pages.

Extended European Search Report dated Sep. 30, 2015, directed to EP Application No. 10849172.1; 5 pages.

Paulino et al., U.S. Office Action mailed Dec. 14, 2015, directed to U.S. Appl. No. 13/313,567; 15 pages.

Dou et al., U.S. Office Action mailed Feb. 8, 2016, directed to U.S. Appl. No. 13/077,302; 5 pages.

\* cited by examiner

BIAXIALLY ORIENTED POLYLACTIC ACID FILM WITH HIGH BARRIER

CROSS-REFERENCE TO RELATED APPLICATION

This application claims the benefit of U.S. Provisional Application Ser. No. 61/089,128, filed Aug. 15, 2008, the entirety of which is incorporated herein by reference.

FIELD OF INVENTION

This invention relates to a multi-layer biaxially oriented polylactic acid (BOPLA) film with a novel formulation which exhibits improved barrier properties, particularly for moisture vapor transmission barrier, after metallizing.

BACKGROUND OF INVENTION

Biaxially oriented polypropylene (BOPP) films used for packaging, decorative, and label applications often perform multiple functions. For example, in laminations they can provide printability, transparent or matte appearance, and/or slip properties. They can further be used to provide a surface suitable for receiving organic or inorganic coatings for gas and moisture barrier properties. They can also be used to provide a heat sealable layer for bag forming and sealing, or a layer that is suitable for receiving an adhesive either by coating or laminating.

However, in recent years, interest in "greener" packaging has been developing. Packaging materials based on biologically derived polymers are increasing due to concerns with renewable resources, raw materials, and greenhouse gases. Bio-based polymers are believed—once fully scaled-up—to help reduce reliance on petroleum, reduce production of greenhouse gases, and can be biodegradable. The biodegradable aspect is of interest to many snack manufacturers so as to provide litter abatement in addition to a lower carbon footprint package. Bio-based polymers such as polylactic acid (PLA)—which is currently derived from corn starch (but can be derived from other plant sugars) and thus, can be considered to be derived from a renewable or sustainable resource—is one of the more popular and commercially available materials available for packaging film applications. Other bio-based polymers such as polyhydroxyalkanoates (PHA) and particularly, polyhydroxybutyrate (PHB) are also of high interest.

For such a bio-based polymer to be fit-for-use for many snack food packaging applications, it is desirable that the bio-based polymer film match as many of the attributes possible that BOPP is well-known for, such as heat sealability, printability, controlled COF, metallizability, barrier, etc. In particular, for high barrier packaging, metallized oriented PLA films should demonstrate good oxygen and moisture barrier properties. For metallized oriented PLA in particular, good oxygen barrier property is generally easily achieved due to the polar nature of PLA, which provides good hydrogen-bonding of the polymer molecules. However, this polar nature tends to be detrimental for achieving high moisture barrier. Without being bound by any theory, the thought is that water molecules—being polar themselves—may more easily migrate through a polar polymer film than a non-polar polymer film.

There are several manufacturers of oriented PLA films, in particular biaxially oriented PLA, but none of them provides a satisfactory moisture barrier property when metallized. For example, the data sheet for Celplast Metallized Products, Ltd.'s Enviromet™ high barrier metallized PLA film describes a product that exhibits an excellent oxygen barrier of 6.2 cc/m$^2$/day (at 23° C., 50% relative humidity or RH) but a relatively poor moisture barrier of 3.1 g/m$^2$/day (at 38° C., 90% RH) as compared to typical metallized biaxially oriented polypropylene films. (High barrier metallized BOPP such as Toray Plastics (America), Inc.'s PWX3 product typically demonstrates oxygen barrier of 15.5 cc/m$^2$/day (23° C., 0% RH) and moisture barrier of 0.155 g/m$^2$/day (38° C., 90% RH).)

Another manufacturer of barrier PLA film, Alcan Packaging Inc., produces a silicon oxide coated PLA film under the tradename Ceramis®. The data sheet for Ceramis® states that this product has an oxygen barrier of 7.75 cc/m$^2$/day (23° C., 50% RH) and moisture barrier of 7.75 g/m$^2$/day (38° C., 90% RH). Biofilm S.A. promotional literature (such as presented at the "Innovation Takes Root" conference hosted by NatureWorks LLC at Las Vegas, Nev. Sep. 16-18, 2008) discusses transparent barrier PLA films demonstrating 3-10 g/m$^2$/day (38° C./90% RH) using various vacuum chamber deposition processes. For both the latter transparent barrier PLA films, vacuum deposition of a metal such, as aluminum on top of the transparent barrier layer (e.g. silicon oxide, aluminum oxide, or other coatings), may be used to improve moisture barrier properties, but such a product is likely to be costly due to the multiple processing steps required.

U.S. application Ser. No. 10/400,056 describes a multi-layer metallized film including a polyolefin core layer (typically of polypropylene), a polyolefin-based tie-layer on one side of the core layer, and a metal receiving layer of PLA on the tie-layer opposite the core layer side. The PLA layer is metallized. Gas barrier properties of this metallized film are very good, with the examples citing moisture barrier as 0.054-0.093 g/m$^2$/day (38° C., 90% RH) and oxygen barrier as 1.09-1.24 cc/m$^2$/day (23° C., 0% RH). However, such a film formulation is primarily based on petrochemicals (such as polypropylene or copolymers thereof), being 96-98 wt % of the total film structure. PLA bio-polymer is only 2-4 wt % of the film. Thus, such a film cannot claim to be a "sustainable" film, being made from a majority amount of petroleum-based resins versus bio-based resins, and also will not be biodegradable.

EP Patent Publication No. 02065178/EP-A1 describes substrates of PET, PEN, and PLA films over-coated with a polyurethane-based coating which is then subjected to a vapor-deposition process in which a metal anchor layer is deposited upon the polyurethane coating and then an inorganic coating deposited upon the metal anchor layer. Gas barrier properties are improved by using this particular type of polyurethane coating with the inorganic layer. However, the improvement of gas barrier properties on oriented PLA substrates without the polyurethane coating is not contemplated.

U.S. Pat. No. 5,147,726 describes capacitor films of PET, polypropylene, polyethylene naphthalate, polyetheretherketone, and polyphenylenesulfide made by a process wherein a primer layer of copper can be vacuum deposited on the substrate prior to metallization with aluminum. This technique improves the strength of the deposited layer. However, this patent recommends the process as being most effective on polyethylene terephthalate (PET) films and does not contemplate PLA films nor the improvement of gas barrier properties on PLA films.

U.S. application Ser. No. 10/536,329 describes transparent aluminum oxide-coated substrates such as PET which are provided with an "ultrathin" dusted metal or metal oxide layer prior to the vapor-deposition of aluminum oxide. The term "ultrathin" means a thickness of a layer that does not allow the formation of a closed layer. Barrier properties of transparent aluminum oxide coated substrates can be improved by this method. However, the application does not contemplate using biopolymers such as PLA or non-transparent, opaque inorganic coatings.

U.S. application Ser. No. 12/332,153 describes biaxially oriented PLA film designs combining polyolefin metal receiving layers with polylactic acid polymer core layer for improved moisture barrier properties after metallizing. However, such a structure is not composed entirely of biodegradable or compostable polymers.

U.S. application Ser. No. 12/333,047 describes a method to produce biaxially oriented PLA films at high transverse orientation rates using a specific processing aid. This reference is incorporated in its entirety in this application.

SUMMARY OF THE INVENTION

The above issues of making high gas and moisture barrier metallized OPLA films are addressed. Embodiments include a sputtering method that deposits a thin layer of a metal primer such as copper onto the PLA metal receiving layer prior to vacuum vapor deposition of aluminum. This pretreatment using a metal primer improves the metal adhesion of a subsequent metal layer, such as the aluminum layer, and also improves the gas barrier of the metallized PLA film when compared to an aluminum metallized PLA film without this pre-treatment. Other "primer" metals are used such as titanium and nickel.

The described methods improve the moisture barrier properties of metallized oriented PLA films while maintaining a high majority percentage of sustainable, bio-based resin content. This allows the films to maintain the degradable properties of these resins, while being economical to produce. Embodiments include a multi-layer film design that incorporates a polylactic acid polymer base layer, a metal "priming" layer such as copper or titanium, deposited upon the polylactic acid polymer layer, and an aluminum layer deposited upon the metal primer layer. This film structure provides improved moisture barrier properties, maintains a majority composition of bio-polymer in the total film construction (ca. 95 wt % or more), and is degradable under biodegradation or composting environmental conditions.

For useful protection of snack food products from staleness and/or rancidity, and to ensure a reasonably adequate shelf-life, the films have a moisture barrier property of at least about 1.0 g/m$^2$/day or better, and more preferably at least about 0.90 g/m$^2$/day or better, 0.70 g/m$^2$/day or better, or 0.5 g/m$^2$/day or better at 100° F. (38° C.) and 90% relative humidity (RH). The films have an oxygen barrier of at least about 46.5 cc/m$^2$/day, and more preferably at least 31 cc/m$^2$/day, at 23° C. and 0% RH.

One embodiment is a multi-layer film including a first layer of a substantially PLA resin-containing blend; a second layer including a primer layer of vapor-deposited or sputter-deposited metal deposited upon one side of the first layer; and a third layer of vapor-deposited aluminum deposited upon the side of the second primer layer that is opposite from the first layer. This first PLA resin-containing blend layer may be considered a base layer to provide the bulk strength of the laminate film. The first PLA layer can be include a crystalline PLA homopolymer or an amorphous PLA homopolymer, or blends thereof. Other additives may be included with this PLA layer such as antiblocks, slip agents, or process aids.

The first PLA-based resin layer may also include other ingredients such as an amount of ethylene-acrylate copolymer that can act as a processing aid to enable high transverse orientation rates of up to 8-11×, particularly if this layer includes a majority amount of crystalline PLA. Without such a processing aid, transverse orientation rates of a highly crystalline PLA layer may be on the order of 3-5×. The first PLA layer may also include an optional amount of amorphous PLA blended with the crystalline PLA as well as the optional ethylene-methacrylate copolymer. The first PLA-based resin layer can also include various additives such as antiblock particles to allow for easier film handling. Non-migratory antiblocks are preferred over migratory slip agents such as fatty amides or silicone oils.

The second primer layer may be primarily a metal such as copper, titanium, palladium, aluminum, chromium, iron, nickel, zinc, silver, indium, tin and their oxides, the preferable metal being copper or titanium, and most preferably, copper. Blends or alloys of the above metals may also be used. This second layer may be deposited upon the surface of one side of the first PLA-based resin layer.

The third metal layer may include a metal such as titanium, vanadium, chromium, manganese, iron, cobalt, nickel, copper, zinc, aluminum, gold, or palladium, the preferred being aluminum. Metal oxides can be used as well, preferably aluminum oxide. Blends of alloys of the above metals can also be used. Preferably, this third metal layer has a thickness of about 5 to 100 nm. Preferably, this third metal layer has an optical density of about 1.5 to 5.0. This third layer may be deposited upon the surface of the second primer layer opposite the surface in contact with the first PLA-based resin layer.

As another embodiment, the multi-layer film may further include other polymeric layers coextruded with the first PLA resin-containing layer. One preferred embodiment may be two coextruded layers including PLA-based resin. For example, a first layer of PLA-based resin and a coextruded skin layer including predominantly amorphous PLA on a surface of the first layer. The choice of a predominantly amorphous PLA resin for this layer may be useful as this can provide heat sealable properties to such a multi-layer film construction for producing packaging bags, pouches, wraps, etc. Upon the side opposite the coextruded amorphous PLA layer of the first PLA-based resin layer side, the metal primer layer and metal layer may be deposited as described previously. A further embodiment may be to coextrude three layers including PLA-based resins. In this embodiment, upon each side of the base or core layer including PLA-based resin, can be coextruded contiguously a layer of PLA-based resin of either the same composition as the core layer or a different composition or blend of crystalline and amorphous PLA resins as desired. In this embodiment, on one surface of one of the outermost PLA layers can be deposited the metal primer layer and then the other metal-containing layer. This embodiment may be useful as it can provide a heat scalable layer or a laminating layer on the non-metal side; and on the side of the layer to receive the priming metal, this third layer of this laminate can include a blend of amorphous PLA and crystalline PLA or other additives that can enhance or improve the deposition and/or adhesion of the metal primer layer.

Preferably, the first PLA resin-containing layer includes a crystalline polylactic acid homopolymer of about 90-100 wt % L-lactic acid units (or 0-10 wt % D-lactic acid units). An optional amount of amorphous PLA may also be blended in with the crystalline PLA from 0-48 wt % of the first layer. The amorphous PLA is also based on L-lactic acid units but has greater than 10 wt % D-lactic acid units and/or meso-lactide units (which includes one each of L and D lactic acid residuals). A preferred amount of amorphous PLA to be blended with the crystalline PLA may be about 15 wt % of the first layer. An optional amount of an ethylene-acrylate copolymer component of the first layer formulation can be used in the amount from about 2-10 wt % of the core layer, particularly if it is desired to make this film by a biaxial orientation process in which transverse orientation may be greater than about 5 times. Antiblock particles of suitable size may be added to the core layer. Suitable particles include amorphous silicas, aluminosilicates, sodium calcium aluminum silicates, crosslinked silicone polymers, and polymethylmethacrylates to aid in machinability and winding. Suitable amounts range from 0.03-0.5% by weight of the core layer and typical particle sizes of 2.0-6.0 μm in diameter.

In the embodiment of a two-layer coextruded substrate, preferably, this coextruded skin layer is a heat sealable PLA resin-containing layer including an amorphous PLA of greater than 10 wt % D-lactic acid units. It may not be necessary to use any of the impact modifier/process aid ethylene-acrylate copolymer in this case, as the amorphous PLA can be oriented relatively easily. This coextruded heat sealable amorphous PLA resin-containing layer can also include an antiblock component selected from amorphous silicas, aluminosilicates, sodium calcium aluminum silicates, crosslinked silicone polymers, and polymethylmethacrylates to aid in machinability and winding and to lower coefficient of friction (COF) properties. Suitable amounts range from 0.03-0.5% by weight of the core layer and typical particle sizes may be from 2.0-6.0 μm in diameter, depending on the final thickness of this layer. Migratory slip additives may also be used to control COF properties such as fatty amides (e.g. erucamide, stearamide, oleamide, etc.) or silicone oils ranging from low molecular weight oils to ultra high molecular weight gels. Suitable amounts of slip additives to use may range from 300 ppm to 10,000 ppm of the layer.

Another embodiment may have this coextruded PLA resin-containing layer include a non-heat-sealable amorphous PLA such as a crystalline PLA resin similar to that used in the first PLA resin-containing layer. In addition, various blends of amorphous and crystalline PLA can be used at similar ratios as described for the first layer. In the case that a crystalline PLA is used or a blend including crystalline PLA, an amount of the ethylene-acrylate copolymer process aid may be used, again in the amount of 2-10 wt % of this layer to enable transverse orientation at high rates. Preferably, this layer will also contain antiblock particles selected from amorphous silicas, aluminosilicates, sodium calcium aluminum silicates, crosslinked silicone polymers, and polymethylmethacrylates to aid in machinability and winding. Suitable amounts range from 0.03-0.5% by weight of the core layer and typical particle sizes of 2.0-6.0 μm in diameter, depending on the final thickness of this layer. Migratory slip additives may also be used to control COF properties such as fatty amides (e.g. erucamide, stearamide, oleamide, etc.) or silicone oils ranging from low molecular weight oils to ultra high molecular weight gels, or blends of fatty amides and silicone oil-based materials. Suitable amounts of slip additives to use can range from 300 ppm to 10,000 ppm of the layer. Preferably, this non-heat sealable embodiment using a coextruded PLA resin-containing layer is a discharge-treated layer having a surface for lamination, metallizing, printing, or coating with adhesives or inks.

Generally, however, where the above embodiments are to be used as a substrate for vacuum deposition metallizing, it is recommended that migratory slip additives not be used as these types of materials may adversely affect the metal adhesion or metallized gas barrier properties of the metallized BOPLA film. It is thought that as the hot metal vapor condenses on the film substrate, such fatty amides or silicone oils on the surface of the film may vaporize and cause pin-holing of the metal-deposited layer, thus compromising gas barrier properties. Thus, only non-migratory antiblock materials should be used to control COF and web-handling.

For these embodiments described above, upon the side of the first PLA layer which is to receive the second "primer" layer of metal, the side of this first layer prior to the deposition of the second primer metal layer may be discharge treated; however, it is preferable to leave this surface untreated in order to avoid potential concerns of over-treating or causing undesirable degradation the surface. If discharge-treatment is desired, in the above embodiments it can be accomplished by several means, including but not limited to corona, flame, plasma, or corona in a controlled atmosphere of selected gases. Preferably, in one variation, the discharge-treated surface has a corona discharge-treated surface formed in an atmosphere of $CO_2$ and $N_2$ to the exclusion of $O_2$. This latter discharge treatment method results in a surface that contains both oxygen and nitrogen-based functional groups, typically in the amount of 0.3-1.0 atomic % nitrogen functional groups.

Preferably, the substrate film is produced via extrusion of the first PLA layer (or coextruded with other polymeric layers as desired) through a compositing die whereupon the molten film is quenched upon a chilled casting roll system or casting roll and water bath system and subsequently oriented in the machine and/or transverse direction into a biaxially oriented film. The machine direction orientation rate may be 2.0-3.0 times and the transverse direction orientation may be 3.0-5.0 times. With the use of the ethylene-acrylate impact modifier process aid in the core layer, transverse direction orientation can be increased to 8.0-11.0 times. Heat setting conditions in the transverse direction orientation (TDO) oven are chosen to minimize thermal shrinkage effects. The film may be wound into a roll form.

This film roll may then be placed within a vacuum metallization chamber in which two types of metallization occurs sequentially. The first deposition step deposits the second primer layer of metal upon the desired side of the PLA substrate; the second deposition step deposits a third, thicker metal layer upon the second primer metal layer. The second primer layer is thinner than the third metal layer. The second primer layer may not be a contiguous layer upon the first layer PLA substrate in that the priming metal may not completely cover the surface of the first layer. The third metal layer, however, is a contiguous layer and completely covers the second primer layer.

The third metal layer may be deposited via vapor-deposition, preferably a vapor-deposited aluminum layer, with an optical density of at least about 1.5, preferably with an optical density of about 2.0 to 4.0, and even more preferably between 2.3 and 3.2.

Additional advantages of this invention will become readily apparent to those skilled in the art from the following detailed description, wherein only the preferred embodiments of this invention is shown and described, simply by way of illustration of the best mode contemplated for carrying out this invention. As will be realized, this invention is capable of other and different embodiments, and its details are capable of modifications in various obvious respects, all without departing from this invention. Accordingly, the examples and description are to be regarded as illustrative in nature and not as restrictive.

DETAILED DESCRIPTION OF THE INVENTION

This invention relates to a multi-layer biaxially oriented polylactic acid (BOPLA) film with a novel formulation which exhibits improved barrier properties, particularly for moisture vapor transmission barrier, after metallizing. This high barrier formulation combines a monolayer of a metal such as copper or titanium and a secondary aluminum layer vacuum deposited onto a PLA metal receiving layer with a PLA core layer to improve metallized moisture and oxygen barrier as well as metal adhesion.

The described embodiments include a unique metallized film structure for PLA-based films that allow improved moisture barrier characteristics after metallizing. In one embodiment, the laminate film includes a multi-layer coextruded film of: 1) A first layer including a crystalline polylactic acid (PLA) polymer and blended with an optional minority amount of amorphous polylactic acid polymer, preferably in the ratio of 85 wt % crystalline PLA and 15 wt % amorphous PLA (this first layer blend can also be optionally blended with an amount of ethylene-acrylate copolymer to help enable high transverse orientation); 2) A second "primer" layer of metal including preferably copper (although other metals can be used) deposited upon one side of the first layer including PLA; and 3) a third layer of metal including preferably aluminum (although other metals can be used) deposited upon the side of the second primer metal layer opposite the side contacting the first PLA-containing layer.

Another embodiment is a laminate film that includes a similar construction as above, except that a coextruded PLA skin layer may be disposed on the side of the PLA-containing first layer blend opposite the second primer metal layer. This coextruded PLA skin layer can include either crystalline PLA resin or amorphous PLA resin or blends thereof. In the case where crystalline PLA resin is part of this layer's formulation, an amount of ethylene-acrylate copolymer can optionally be incorporated as in the core layer formulation to help enable high transverse orientation. Generally, it is preferable to use an amorphous PLA to impart heat sealable characteristics to this film design. If using this layer as a non-heat sealable layer, it may be desirable to discharge-treat the exposed surface of this third layer in order to provide further functionality as a surface to receive metallization, printing, coating, or laminating adhesives.

The polylactic acid resin that may be included in the first layer is a crystalline polylactic acid of a specific optical isomer content that can be biaxially oriented. As described in U.S. Pat. No. 6,005,068, lactic acid has two optical isomers: L-lactic acid (also known as (S)-lactic acid) and D-lactic acid (also known as (R)-lactic acid). Three forms of lactide can be derived from these lactic acid isomers: L,L-lactide (also known as L-lactide) and which includes two L-lactic acid residuals; D,D-lactide (also known as D-lactide) and which includes two D-lactic acid residuals; and meso-lactide which includes one each of L and D-lactic acid residuals. The degree of crystallinity is determined by relatively long sequences of a particular residual, either long sequences of L or of D-lactic acid. The length of interrupting sequences is important for establishing the degree of crystallinity (or amorphous) and other polymer features such as crystallization rate, melting point, or melt processability.

The crystalline polylactic acid resin maybe one that includes primarily of the L-lactide isomer with minority amounts of either D-lactide or meso-lactide or combinations of D-lactide and meso-lactide. Preferably, the minority amount is D-lactide and the amount of D-lactide is 10 wt % or less of the crystalline PLA polymer. More preferably, the amount of D-lactide is less than about 5 wt %, and even more preferably, less than about 2 wt %. Suitable examples of crystalline PLA include Natureworks® Ingeo™ 4042D and 4032D. These resins have relative viscosity of about 3.9-4.1, a melting point of about 165-173° C., a crystallization temperature of about 100-120° C., a glass transition temperature of about 55-62° C., a D-lactide content of about 4.25 wt % and 1.40 wt % respectively, density of about 1.25 g/cm$^3$, and a maximum residual lactide in the polylactide polymer of about 0.30% as determined by gas chromatography. Molecular weight $M_w$ is typically about 200,000; $M_n$ typically about 100,000; polydispersity about 2.0. Natureworks® 4032D is the more preferred crystalline PLA resin, being more crystalline than 4042D and more suitable for high heat biaxial orientation conditions. In addition, the 4042D PLA grade contains about 1000 ppm of erucamide and for some applications, particularly for gas barrier metallizing, may not be suitable.

The first PLA containing layer can be of any thickness after biaxial orientation, but may be typically 8 μm to 100 μm in thickness, preferably between 10 μm and 50 μm, and more preferably between about 15 μm and 25 μm in thickness. A preferred embodiment utilizes a higher crystalline, higher L-lactide content PLA (lower wt % D-lactide of about 1.40) such as Natureworks® 4032D.

The first PLA containing layer may include an amount of amorphous PLA resin blended with the crystalline PLA to improve further extrusion processing and oriented film processing. The addition of amorphous PLA in the core layer helps to lower extrusion polymer pressure and in terms of film manufacturing, helps to reduce or slow crystallization rate of the newly oriented film. This aids in the orientation of the PLA film in both machine and transverse directions and helps reduce defects such as uneven stretch marks. It also helps with the slitting of the biaxially oriented film at the edge-trimming section of the film orientation line by reducing the brittleness of the edge trim and reducing the instances of edge trim breaks which can be an obstacle to good productivity. The amorphous PLA may be preferably based on a L-lactide isomer with D-lactide content of greater than 10 wt %. A suitable amorphous PLA to use is Natureworks® Ingeo™ 4060D grade. This resin has a relative viscosity of about 3.25-3.75, $T_g$ of about 52-58° C., seal initiation temperature of about 80° C., density of about 1.24 g/cm$^3$, a D-lactide content of about 12 wt %, and a maximum residual lactide in the polylactide polymer of about 0.30% as determined by gas chromatography. Molecular weight $M_w$ is about 180,000.

Suitable amounts of amorphous PLA to use in the first PLA containing layer may include concentrations of up to about 48 wt % of the first layer, preferably up to about 30 wt % of the first layer, and even more preferably about 15 wt % of the first layer. It should be noted, however, that too much amorphous PLA in the first layer (e.g. 50% or greater) can cause high thermal shrinkage rates after biaxial orientation and in spite of heat-setting conditions in the transverse orientation oven to make a thermally stable film. A thermally, dimensionally stable film may be important if the substrate may be used as a metallizing, printing, coating, or laminating substrate. (However, if the BOPLA is desired as a shrinkable film, this composition and appropriate processing conditions might be suitable.)

Another optional component that can be blended into the primarily crystalline PLA first layer is a minority amount of ethylene-acrylate copolymer to enable high transverse orientation rates similar to that used in BOPP orientation, if desired. It may be desirable to do this as the higher orientation rate may be beneficial for profile control and economies of scale in terms of a wider film production.

Ethylene-acrylates are of the general chemical formula of $CH_2=C(R^1)CO_2R^2$ where $R^1$ can be hydrogen or an alkyl group of 1-8 carbon atoms and $R^2$ is an alkyl group of 1-8 carbon atoms. Preferred ethylene-acrylate copolymers may be based on ethylene-acrylate, ethylene-methacrylate, ethylene-n-butyl acrylate-glycidyl methacrylate, ethylene-glycidyl methacrylate, ethylene-butyl-acrylate, ethylene acrylic esters, or blends thereof. Ethylene vinyl acetate (EVA) and ethylene methacrylate (EMA) can also be used. Other similar materials may also be used. As described in U.S. Pat. No. 7,354,973, suitable compositions of the ethylene-acrylate copolymers can be about 20-95 wt % ethylene content copolymerized with about 3-70 wt % n-butyl acrylate and about 0.5-25 wt % glycidyl methacrylate monomers. A particularly suitable ethylene-acrylate copolymer of this type is one produced by E. I. DuPont de Nemours and Company Packaging and Industrial Polymers Biomax® Strong 120. This additive has a density of about 0.94 g/cm$^3$, a melt flow rate of about 12 g/10 minutes at 190° C./2.16 kg weight, a melting point of about 72° C., and a glass transition temperature of about −55° C. Other suitable ethylene-acrylate copolymer impact modifiers commercially available are: DuPont Elvaloy® PTW, Rohm & Haas, Inc. BPM500, and Arkema, Inc. Biostrength® 130.

Suitable amounts of ethylene-acrylate copolymer to be blended in the crystalline PLA-containing first layer may be from 2-10 wt % of the first layer, preferably 2-7 wt % and more preferably, 3-5 wt %. At these concentrations, acceptable clarity of the biaxially oriented film may be maintained. Too much ethylene-acrylate may cause haziness; too little may not enable transverse orientation at high rates like 8-10×. Blending into the first layer can be done most economically by dry-blending the respective resin pellets; it is contemplated that more aggressive blending such as melt-compounding via single-screw or twin-screw can result in better dispersion of the ethylene-acrylate copolymer throughout the PLA matrix.

Additionally, the first PLA-containing layer may also include a minority amount of antiblocking additives. It is often desirable to add an amount of antiblocking agent to this first PLA containing and metal receiving layer for aiding machinability and winding. An amount of an inorganic antiblock agent can be added in the amount of 100-5000 ppm of the first PLA containing layer, preferably 300-2000 ppm. Preferred types of antiblock are spherical sodium aluminum calcium silicates or an amorphous silica of nominal 2-6 μm average particle diameter, but other suitable spherical inorganic antiblocks can be used including crosslinked silicone polymer (such as Toshiba Silicone's Tospearl® grades of polymethlysilsesquioxane of nominal 2.0 and 3.0 μm sizes) or polymethylmethacrylate, and ranging in size from 2 μm to 6 μm. Preferred may be a nominal 3 μm spherical sodium aluminum calcium silicate manufactured by Mizusawa Chemicals under the tradename Silton® JC-30 at a loading of about 500 ppm in the first PLA containing layer.

In some of the embodiments, the first PLA resin-containing layer may be surface treated on one side with either an electrical corona-discharge treatment method, flame treatment, atmospheric plasma, or corona discharge in a controlled atmosphere of nitrogen, carbon dioxide, or a mixture thereof, with oxygen excluded and its presence minimized. The latter method of corona treatment in a controlled atmosphere of a mixture of nitrogen and carbon dioxide is particularly preferred. This method results in a treated surface that includes nitrogen-bearing functional groups, preferably at least 0.3 atomic % or more, and more preferably, at least 0.5 atomic % or more. This treated surface layer can then be used for subsequent purposes of metallizing, printing, coating, or laminating, preferably metallizing.

If an embodiment is made using an additional skin layer on the side of the first PLA resin-containing layer opposite the side to receive the second primer metal layer and third metal layer, this coextruded skin layer can be a heat sealable resin layer including an amorphous polylactic acid polymer. The heat sealable resin layer can be coextruded on one side of the first PLA resin-containing layer opposite the metal receiving side, the heat sealable layer having a thickness after biaxial orientation of between 0.5 and 5 μm, preferably between 1.0 and 2.0 μm. As described earlier, the amorphous PLA may be based on a L-lactide isomer with D-lactide content of greater than 10 wt %. A suitable amorphous PLA to use is Natureworks® Ingeo™ 4060D grade. This resin has a relative viscosity of about 3.25-3.75, $T_g$ of about 52-58° C., seal initiation temperature of about 80° C., density of about 1.24 g/cm$^3$, a D-lactide content of about 12 wt %, and a maximum residual lactide in the polylactide polymer of about 0.30% as determined by gas chromatography. Molecular weight $M_w$ is about 180,000. The preferred amount to be used as a heat sealable skin layer is about 100 wt % of the layer. It is also preferred to add an amount of inorganic antiblock to this layer to aid in web-handling, COF control, film winding, and static control, among other properties. Suitable amounts may be about 1000-5000 ppm of the heat sealable resin layer, preferably 3000-5000 ppm.

Preferred types of antiblock are spherical crosslinked silicone polymer such as Toshiba Silicone's Tospearl® grades of polymethlysilsesquioxane of nominal 2.0 and 3.0 μm sizes. Alternatively, sodium aluminum calcium silicates of nominal 3 μm in diameter can also be used (such as Mizusawa Silton® JC-30), but other suitable spherical inorganic antiblocks can be used including polymethylmethacrylate, silicas, and silicates, and ranging in size from 2 μm to 6 μm. Migratory slip agents such as fatty amides or silicone oils can also be optionally added to the heat seal resin layer of types and quantities mentioned previously if lower COF is desired. However, if the films are to be used for metallizing, it is recommended that the use of migratory slip additives be avoided in order to maintain metallized barrier properties and metal adhesion.

The coextrusion process can include a multi-layered compositing die, such as a two-, three-, or four-layer die (or more). In the case of a 2-layer coextruded film embodiment, a two-layer compositing die can be used. One embodiment as described previously is to coextrude two layers including a first PLA resin-containing layer and a heat sealable amorphous PLA resin-containing layer.

In the case of a 3-layer coextruded film, a 3-layer compositing die can be used whereby a PLA resin-containing core layer can be sandwiched between the heat sealable amorphous PLA resin layer and the first PLA resin-containing layer which is also the metal receiving layer.

If the three-layer coextruded film embodiment is chosen, the first PLA resin-containing layer coextruded on one side of the PLA core layer is the metal receiving layer; the skin layer coextruded on the opposite side of the PLA core layer may be a heat sealable resin layer. Both the first PLA resin-containing layer and the heat sealable skin layer preferably have a thickness after biaxial orientation between 0.5 and 5 μm, preferably between 0.5 and 3 μm, and more preferably between 1.0 and 2.0 μm.

In addition, another embodiment that can be considered may be to replace the heat sealable amorphous PLA layer with a non-sealable PLA layer. In this variation, amorphous or crystalline PLA may be used, or blends thereof. In the case of making this layer non-sealable, preferably crystalline PLA should be used, either by itself or as the majority component of a blend with amorphous PLA. As discussed previously, if crystalline PLA is used for this layer, an optional amount of ethylene-acrylate copolymer can be used as part of this layer to aid high transverse orientation rates. Suitable amounts of ethylene-acrylate copolymer to use in this skin layer may be 2-10 wt %, preferably 2-7 wt % and, more preferably, 3-5 wt %. Preferably, non-migratory inorganic slip and/or antiblock additives as described previously should be used to maintain gas barrier properties and metal adhesion if metallizing, or ink wetting and ink adhesion if printing. It is also preferred to add an amount of inorganic antiblock to this layer to aid in web-handling, COF control, film winding, and static control, among other properties. Suitable amounts may be about 1000-5000 ppm of the this non-heat sealable resin layer, preferably 3000-5000 ppm. Preferred types of antiblock are spherical crosslinked silicone polymer such as Toshiba Silicone's Tospearl® grades of polymethlysilsesquioxane of nominal 2.0 and 3.0 μm sizes. Alternatively, sodium aluminum calcium silicates of nominal 3 μm in diameter can also be used (such as Mizusawa Silton® JC-30), but other suitable spherical inorganic antiblocks can be used including polymethylmethacrylate, silicas, and silicates, and ranging in size from 2 μm to 6 μm. It may be preferred to discharge-treat the exposed side of this layer so as to enable adequate adhesion and wet-out of adhesives or inks or coatings to this side. In particular, cold seal latexes can be applied to this discharge-treat surface.

The multilayer coextruded films can be made either by sequential biaxial orientation or simultaneous biaxial orientation which are well-known processes in the art. On a 1.5 meter wide sequential orientation line, the multilayer coextruded laminate sheet may be coextruded at melt temperatures of about 190° C. to 215° C. as appropriate for the layer resin composition (i.e. whether the specific extruder is processing predominantly PLA or polyolefin resin blend) and cast and pinned—using electrostatic pinning or air pinning—onto a cooling drum whose surface temperature may be controlled between 15° C. and 26° C. to solidify the non-oriented laminate sheet at a casting speed of about 6 mpm. The non-oriented laminate sheet may be stretched first in the longitudinal direction at about 40° C. to 65° C. at a stretching ratio of about 2 to about 4 times the original length, preferably about 3.0 times, using differentially heated and sped rollers and the resulting stretched sheet may be heat-set at about 40-45° C. on annealing rollers and cooled at about 25-40° C. on cooling rollers to obtain a uniaxially oriented laminate sheet. The uniaxially oriented laminate sheet may then be introduced into a tenter at a linespeed of about 18-50 mpm and preliminarily heated between 65° C. and 75° C., and stretched in the transverse direction at a temperature of about 75-105° C. and at a stretching ratio of about 3 to about 8 times, preferably 3-5 times, the original length and then heat-set or annealed at about 115-145° C. to reduce internal stresses due to the orientation and minimize shrinkage and give a relatively thermally stable biaxially oriented sheet. TD orientation rates were adjusted by moving the transverse direction rails in or out per specified increments.

The biaxially oriented film has a total thickness between 10 and 100 μm, preferably between 15 and 30 μm, and most preferably between 20 and 25 μm. For simultaneous orientation, the machine direction and transverse direction stretching are done simultaneously using a specially designed tenter-frame and clip and chain design which obviates the need for a machine direction orienter of driven and heated rollers. The film substrate can be discharge-treated if desired, but preferably was left untreated, and was wound up into roll form and then placed inside a suitable vacuum metallizing chamber designed for vapor-deposition of metal.

A "primer" layer of a metal is deposited upon one surface of the first PLA resin-containing layer. This primer layer has been found to be efficacious in improving the barrier properties and metal adhesion of a another metal layer deposited upon this primer layer. As described in the specification of EP application publication 02065178/EP-A1, the metal primer layer may be formed by a method wherein a cathode metal functioning as a discharging electrode is sputtered onto one side of the first PLA resin-containing film layer under a glow discharge inside a vacuum chamber such as used commonly in vapor deposition of metals, and in which the first PLA resin-containing layer surface is also activated or discharge-treated at the same time. The film may be treated in this manner typically in the low vacuum pressure section of the metallizing chamber where the unwinding film roll is located and the film is passed through this glow discharge treater prior to entering the high vacuum section of the metallizer where the vapor-deposition evaporation boats are located. The glow discharge treater uses a high voltage between the anode and cathode to produce free electrons. A gas may be introduced into the treater and the free electrons combine with the gas to produce ions. Magnetic fields guide and accelerate the gas ions onto the metal cathode target which then emit metal ions. These metal ions are then deposited upon the first PLA resin-containing layer, creating a primer layer which may be a mono-layer of the metal atoms and which may be an incompletely contiguous or enclosed layer.

The pressure range within the vacuum chamber in which the glow discharge takes place may be in the range of $10^{-1}$ to $10^{-4}$ torr, power supply to frequency may be DC to about 50 MHz, power supply voltage may be from about 50 v to 10 kv, and discharge electric current density may be from about 1 to 400 $mA\text{-}min/m^2$. The power setting for the glow discharge may be 300 to 500 v, and more preferably, 380 to 480 v.

Suitable gases for the discharge gas in the discharge atmosphere are those chosen from oxygen, nitrogen, argon, carbon dioxide, water vapor, and blends thereof. Preferably, the chosen gas is oxygen or nitrogen, and more preferably, nitrogen. Without being bound by any theory, the formed metal primer layer thus deposited enhances the nucleation, formation and adherence of a subsequent vapor-deposited metal or inorganic layer upon the primer layer. Suitable gas flow rates are in the range of 0.5-5.0 l/min, preferably 1.0-2.0 l/min.

As a metal for forming the sputtered metal primer layer (i.e. the target cathode metal), suitable metals are chosen from aluminum, chromium, iron, nickel, copper, zinc, gold, silver, indium, tin, titanium, palladium, platinum, and their oxides. Alloys or blends of the suitable metals may also be used. Preferably, copper or titanium is used as the cathode for sputtering. The deposited metal primer layer can contain a product of discharge gas such as metal nitride.

The amount of sputter-deposited metal primer layer may be in the range of 5 to 2000 $ng/cm^2$, preferably 100-1000 $ng/cm^2$, and more preferably, about 500-1000 $ng/cm^2$. This can be determined by preparing a known amount of sputter-treated film with the primer metal layer and placing the film in a 1-mol concentration of nitric acid to dissolve the metal and analyzing for the metal content using atomic absorption spectroscopy or inductively coupled plasma spectroscopy (ICP-OES). The amount of sputter-deposited metal primer layer on the first PLA resin-containing layer can also be analyzed using XPS/ESCA in which the amount of metal content on the surface may be from about 0.1-2.0 atomic %, and preferably about 0.3-0.6 atomic %.

The next step may be to metallize the metal-primed surface of the first PLA resin-containing layer. This first PLA resin-containing layer with a second primer metal layer deposited upon one surface of the first layer, is then passed into the high vacuum deposition chamber of the metallizer in which a third layer of metal is vapor-deposited upon the surface of the second primer metal layer opposite the first PLA resin-containing layer. It is preferable to conduct the sputter-deposited primer metal process and the vapor-deposited metal process in a single pass within the vacuum metallizing chamber for efficient productivity and efficacy in reducing contamination of the priming metal layer. The vapor-deposited metal film may include titanium, vanadium, chromium, manganese, iron, cobalt, nickel, copper, zinc, aluminum, gold, or palladium, the preferred being aluminum due to its low cost and effectiveness in vapor deposition. Metal oxides can also be used, the preferred being aluminum oxide. This third layer of vapor-deposited metal can have a thickness between 5 and 100 nm, preferably between 20 and 80 nm, more preferably between 30 and 60 nm; and an optical density between 1.5 and 5.0, preferably between 2.0 and 4.0, more preferably between 2.2 and 3.2. The primed and metallized film may then be tested for oxygen and moisture gas permeability, optical density, metal adhesion, metal appearance and gloss, and can be made into a laminate structure with other substrates for applications such as pouches for food packaging.

Without being bound by any theory, in the case where copper is used as the target cathode for depositing the primer layer onto the first PLA resin-containing layer and aluminum is used as the vapor-deposited layer, it is believed that the copper ions bond to the polar sites of the polylactic acid polymer substrate and that the copper bonds better to these sites than aluminum does. These copper sites, in turn, provide a nucleation site for aluminum deposition and bonding. The bonding, in turn, of the aluminum vapor onto these copper priming sites is also very good and enhances the overall adhesion and crystal growth of the aluminum. This results in better aluminum bonding and barrier properties to the PLA substrate overall.

Indeed, this improvement in properties can be found with other polar substrates other than one made with polylactic acid polymer. Polyhydroxyalkanoates (PHA) and other related polymers of the type —[—O—CHR—$(CH_2)_x$—CO—]— wherein R can be various side chains of carbon, such as polyhydroxybutyrate (PHB) where R=$CH_3$ and x=1, poly(hydroxy-butyrate-co-hydroxyvalerate) (PHBV) where R=$C_2H_5$ and x=1, and poly(hydroxybutyrate-co-hydroxyhexanoate) (PHBH) where R=$C_3H_7$ and x=1, can also benefit from this type of metal priming and metallization. Other biodegradable polymers such as polyglycolic acid (PGA), polycaprolactone (PCL), polybutylene succinate/adipate (PBSA), and poly(butylene adipate-co-butylene-terephthalate) (PBAT), and others as well as blends or copolymers thereof, can also be used. In particular, for the improvement of moisture barrier properties, the use of PGA and PHA is particularly preferred as these polymers tend to have inherently better resistance to moisture than PLA does and may make for a better metal receiving layer for the metal primer and metal vapor deposition than a PLA resin-containing layer and which also have biodegradable properties like PLA.

This invention will be better understood with reference to the following examples, which are intended to illustrate specific embodiments within the overall scope of the invention.

Example 1

A 2-layer coextruded biaxially oriented PLA film was made using sequential orientation on a 1.5 meter wide tenter frame line, including a first layer of Natureworks® 4032D crystalline PLA at about 76 wt % of the layer and dry-blended with about 20 wt % of Natureworks® 4060D amorphous PLA and an amount of about 4 wt % ethylene-acrylate copolymer Biomax® 120. A coextruded heat sealable layer on one side of the first PLA containing layer includes about 94 wt % of this layer of substantially of Natureworks® 4060D. An antiblock masterbatch of 5 μm silica at a loading of 5 wt % of the masterbatch in a carrier resin of amorphous PLA (4060D) was added to the coextruded heat sealable skin layer at about 6 wt % of this skin layer for an effective antiblock loading of 3000 ppm.

The total thickness of this film substrate after biaxial orientation was ca. 80 G or 0.8 mil or 20 μm. The thickness of the respective coextruded heat sealable PLA resin layer after biaxial orientation was ca. 8 G (2.0 μm). The thickness of the first PLA resin-containing layer after biaxial orientation was ca. 72 G (18.0 μm). The heat sealable layer and the first PLA layer were melt processed at nominal 380° F. and 400° F. (193° C. and 204° C.), respectively. The 2-layer co-extrudate was passed through a flat die to be cast on a chill drum of 60° F. (15.5° C.) using an electrostatic pinner. The formed cast sheet was passed through a series of heated rolls at 110-145° F. (43-63° C.) with differential speeds to stretch in the machine direction (MD) at ca. 3.25× stretch ratio. This was followed by transverse direction (TD) stretching at ca. 8.0× stretch ratio in the tenter oven at 155-180° F. (68-82° C.) and heat-set or annealed to reduce film shrinkage effects at ca. 200° F. (93° C.). The resultant biaxially oriented film was then wound up in roll form.

The 2-layer film substrate was then metallized in a vacuum metallizing chamber using the glow discharge sputtering process described previously, using a copper cathode target at a voltage of 401.62 v and using oxygen gas ($O_2$) at a flow rate of 1.5 l/min. After deposition of this copper primer layer, this primed substrate was followed by vapor deposition metallization using aluminum to a nominal optical density target of 2.4. The metallized rolls were then slit on a film slitter and tested for properties.

Example 2

The process of Example 1 was repeated except the voltage was set to 420.72 v.

Example 3

The process of Example 1 was repeated except the voltage was set to 430.72 v.

Example 4

The process of Example 1 was repeated except the voltage was set to 440.97 v.

Example 5

The process of Example 1 was repeated except that the gas was changed from oxygen gas ($O_2$) to nitrogen gas ($N_2$) and the voltage set at about 410 v.

Example 6

The process of Example 1 was repeated except that the copper cathode target was replaced with a titanium cathode target and the voltage setting ca. 420 v.

Comparative Example 1

The process of Example 1 was repeated except that the PLA substrate was not primed or treated with the copper glow discharge process and was metallized using only the vapor deposition of aluminum to an optical density target of nominal 2.4.

The metallized properties of the Examples ("Ex") and Comparative Example ("CEx.") are shown in Table 1. The samples were tested for oxygen transmission rate ($O_2TR$), moisture transmission rate (MVTR) and metal adhesion. Desired $O_2TR$ target was 46.5 cc/m$^2$ or less, desired MVTR target was 1.0 g/m$^2$ or less, and metal adhesion target 50 g/in or higher.

In conclusion, there may be a "sweet spot" wherein power settings, voltages, and gas flow can be optimized for the primer metal mono-layer deposition upon the PLA film surface as shown by Examples 1 through 4, with Example 2 exemplifying the optimum. Similar optimal levels can be sought using $N_2$ gas and/or using Ti cathode target. Thus, of the foregoing Examples and Comparative Example, the Examples which used a novel combination of a metal primer layer and vapor-deposition of metal, demonstrated a desired improvement in moisture barrier properties.

TABLE 1

| Sample | Example Layer Composition (wt % of layer) 1st PLA Layer | Example Layer Composition (wt % of layer) Coextruded Layer | Glow Discharge sputtering settings Cathode metal | Glow Discharge sputtering settings Power (kW) | Glow Discharge sputtering settings Voltage (V) | Glow Discharge sputtering settings Gas | Glow Discharge sputtering settings Gas Flowrate (l/min) | MVTR g/m$^2$/day | O2TR cc/m$^2$/day | Al Metal Adh. (g/in) |
|---|---|---|---|---|---|---|---|---|---|---|
| Ex. 1 | PLA 4032D (76%) PLA 4060D (20%) BIOMAX 120 (4%) | PLA 4060D (94%) Antiblock MB (6%) | Cu | 15.9 | 401.62 | $O_2$ | 1.5 | 0.88 | 14.5 | 88 |
| Ex. 2 | Same as Ex 1 | Same as Ex 1 | Cu | 18.6 | 420.72 | $O_2$ | 1.5 | 0.69 | 28.8 | 179 |
| Ex. 3 | Same as Ex 1 | Same as Ex 1 | Cu | 19.9 | 430.27 | $O_2$ | 1.5 | 0.93 | 22.6 | 83 |
| Ex. 4 | Same as Ex 1 | Same as Ex 1 | Cu | 21.4 | 440.97 | $O_2$ | 1.5 | 1.17 | 12.6 | 76 |
| Ex. 5 | Same as Ex 1 | Same as Ex 1 | Cu | 17.3 | 410 | $N_2$ | 1.5 | 0.87 | 7.1 | 71 |
| Ex. 6 | Same as Ex 1 | Same as Ex 1 | Ti | 18.5 | 420 | $O_2$ | 1.5 | 0.65 | 6.2 | — |
| CEx. 1 | Same as Ex 1 | Same as Ex 1 | None | 0 | 0 | None | 0 | 1.31 | 31.0 | 65 |

As Table 1 shows, Comparative Example 1 (CEx 1), which is a control film using a biaxially oriented PLA film metallized with no metal priming layer showed moisture barrier poorer than target. Metal adhesion and oxygen barrier, however, were adequate.

Example 1 (Ex 1) used the copper metal priming layer process at a lower voltage setting of nom. 401.62 v and achieved targeted gas barrier properties and metal adhesion.

Example 2 (Ex 2) used a higher voltage setting of nominal 430.27 v and significantly improved moisture barrier and metal adhesion properties over CEx 1 and Ex 1. Oxygen barrier met target desired.

Example 3 (Ex 3) used a higher voltage setting of nominal 430.27 v although moisture barrier and metal adhesion met desired targets, values were worse than Ex 2. This might indicate that this higher power setting may be degrading the PLA polymer surface causing a weak boundary layer.

Example 4 (Ex 4) used a higher voltage setting of nominal 440.97 v. In this case, moisture barrier property was significantly worsened, although metal adhesion and oxygen properties still met respective targets. Similar to Ex 3, the higher power setting might be causing degradation of the PLA substrate surface.

Example 5 (Ex 5) used nitrogen gas instead of oxygen gas and used a voltage setting of ca. 410 v. Moisture and oxygen barrier and metal adhesion were improved over CEx. 1.

Example 6 (Ex 6) used a titanium cathode target instead of copper to produce a titanium primer layer at a voltage setting of 410 v. Moisture and oxygen barrier properties were significantly improved over CEx. 1.

Test Methods

The various properties in the above examples were measured by the following methods:

Moisture transmission rate of the film was measured by using a Mocon PERMATRAN 3/31 unit substantially in accordance with ASTM F1249. A hand-lamination was made of the metallized PLA film using a 5.5-mil (137.5 μm) cast LDPE film with a pressure-sensitive adhesive (available from Berry Plastics, Inc. 502A clear LDPE tape with acrylic-based pressure sensitive adhesive) in order to protect the metallized film surface from handling damage. The pressure-sensitive adhesive side of the LDPE film may be adhered to the metallized side of the example film with a rubber roller to eliminate air pockets, bubbles, and wrinkles. In general, preferred values of MVTR may be less than 1.0 g/m$^2$/day and preferably 0.5 g/m$^2$/day or less at 100° F. (38° C.) and 90% relative humidity.

Oxygen transmission rate of the film was measured by using a Mocon Oxtran 2/20 unit substantially in accordance with ASTM D3985. A hand-lamination was made of the metallized PLA film using a 1-mil (25 μm) cast LDPE film with a pressure-sensitive adhesive (available from Berry Plastics, Inc. 502A clear LDPE tape with acrylic-based pressure sensitive adhesive) in order to protect the metallized film surface from handling damage. The pressure-sensitive adhesive side of the LDPE film may be adhered to the metallized side of the example film with a rubber roller to eliminate air pockets, bubbles, and wrinkles. In general, preferred values of $O_2TR$ may be equal or less than 46.5 cc/m$^2$/day and preferably 31 cc/m$^2$/day or less at 73° F. (23° C.) and 0% relative humidity.

Metal adhesion was measured by heat sealing on a SENTINAL Sealer model 12 ASL at 220° F. (104.4° C.) seal temperature, 15 second dwell, and 15 psi (103.42 kPa) seal jaw pressure, a piece of 1-mil (25 μm) thick Ethylene Acrylic Acid polymer film (EAA) to the metallized surface of a single sheet of metallized film and measuring the 180° peel strength of the metal from the substrate substantially in accordance with AIMCAL (Association of Industrial Metallizers, Coaters, and Laminators) test procedure TP-105-92. The test procedure and a kit of materials can be obtained from AIMCAL's website www.aimcal.com. The Metal Adhesion Test Kit is designed to permit testing using TP-105-92. The test kit contains 2 rolls of 3M™ tape #610, 2 rolls of EAA film and an AIMCAL Metallizing Technical Reference Manual. The test kit contains enough material to do at least 100 tests as described in the Technical Reference Manual, (TP-105-92). The test procedure used in testing the samples used in the examples of this application is described in AIMCAL Metallizing Technical Reference (Third Edition, © 2001). In general, preferred values of metal adhesion ranged from about 50 g/in (50 g/25 mm) minimum or higher.

Metal primer layer content was quantitatively determined by the following procedure: 1) Prepare 4 samples of the desired metallized film of 100 mm×100 mm size; 2) Cut the sample films into small pieces and place into a flask; 3) Fill the flask with 20 ml of 1 mol concentration nitric acid, ensuring that the cut film samples are immersed in the nitric acid; 4) Let sit for 24 hours, stirring occasionally, until the solution turns clear due to all the metal on the film samples dissolving; 5) Analyze the nitric acid solution by atomic absorption spectroscopy or by inductively coupled plasma spectroscopy (ICP-OES) for copper content (or other primer metal content).

Atomic concentrations (atomic %) of metal primer layer content on the example substrate surface was detected using XPS/ESCA analysis. X-ray source was monochromated Alk$_\alpha$ 1486.6 eV, acceptance angle+/−7°, take-off angle 65°, analysis area 2.0×0.8 mm, and charge correction neutralizer only. Atomic concentration values were normalized to 100% using the elements detected.

Degradability of the film was measured substantially in accordance with ASTM procedure D-6400 "Compostable Plastics," sub-group procedure D-5338 "Disintegration Test." This ASTM procedure is also known as ISO 1629 in the International Standards test procedures. In essence, the test films are aged under composting conditions of 58° C. for 180 days maximum duration in a compost medium and films are observed and rated for disintegration.

This application discloses several numerical ranges in the text and figures. The numerical ranges disclosed inherently support any range or value within the disclosed numerical ranges even though a precise range limitation is not stated verbatim in the specification because this invention can be practiced throughout the disclosed numerical ranges.

The above description is presented to enable a person skilled in the art to make and use the invention, and is provided in the context of a particular application and its requirements. Various modifications to the preferred embodiments will be readily apparent to those skilled in the art, and the generic principles defined herein may be applied to other embodiments and applications without departing from the spirit and scope of the invention. Thus, this invention is not intended to be limited to the embodiments shown, but is to be accorded the widest scope consistent with the principles and features disclosed herein. Finally, the entire disclosure of the patents and publications referred in this application are hereby incorporated herein by reference.

We claim:

1. A biaxially oriented film comprising:
a first layer comprising a polylactic acid polymer;
a noncontiguous second layer comprising metal on a surface of the first layer, wherein the second layer has a weight per area of 5 to 2000 ng/cm$^2$; and
a third layer comprising metal on a surface of the second layer,
wherein all polymer containing layers in the biaxially oriented film comprise polylactic acid polymer and the film has a moisture vapor transmission rate of 1.0 g/m$^2$/day or less at 100° F. and 90% relative humidity.

2. The film of claim 1, wherein the second layer is deposited on the surface of the first layer by sputtering.

3. The film of claim 1, wherein the second layer comprises copper.

4. The film of claim 1, wherein the third layer is deposited on the surface of the second layer by vacuum vapor deposition.

5. The film of claim 1, wherein the third layer comprises aluminum.

6. The film of claim 1, wherein the second layer comprises titanium or nickel.

7. The film of claim 1, wherein the first layer comprises a crystalline PLA homopolymer of 90-100 wt % L-lactic acid units.

8. The film of claim 7, wherein the first layer comprises an amorphous PLA homopolymer of greater than 10 wt % D-lactic acid units and/or meso-lactide units.

9. The film of claim 1, wherein the first layer comprises an ethylene-acrylate copolymer.

10. The film of claim 1, wherein the film has been transverse oriented 8-11 times.

11. The film of claim 1, wherein the third layer has a thickness of about 5 to 100 nm.

12. The film of claim 1, further comprising a fourth layer comprising a polylactic acid polymer on a surface of the first layer.

13. The film of claim 12, further comprising a fifth layer comprising polylactic acid on a surface of the forth layer.

14. The film of claim 12, wherein the fourth layer is heat sealable.

15. A biaxially oriented film comprising:
a first layer comprising a polylactic acid polymer;
a noncontiguous second layer comprising metal on a surface of the first layer, wherein the second layer has a weight per area of 5 to 2000 ng/cm$^2$;
a third layer comprising metal on a surface of the second layer; and
a fourth layer comprising a polylatic acid polymer, wherein the forth layer is heat sealable, wherein all polymer containing layers in the biaxially oriented film comprise polylactic acid polymer and the film has a moisture vapor transmission rate of 1.0 g/m$^2$/day or less at 100° F. and 90% relative humidity.

16. A biaxially oriented film comprising:
a first layer comprising a polylactic acid polymer;
a noncontiguous second layer comprising metal on an untreated surface of the first layer, wherein the second layer has a weight per area of 5 to 2000 ng/cm$^2$; and
a third layer comprising metal on a surface of the second layer;
wherein the film has a moisture vapor transmission rate of 1.0 g/m$^2$/day or less at 100° F. and 90% relative humidity.

17. A biaxially oriented film comprising:
a first layer comprising a polylactic acid polymer;

a second layer consisting essentially of copper or titanium on a surface of the first layer, wherein the second layer has a weight per area of 5 to 2000 ng/cm$^2$; and a third layer comprising aluminum on a surface of the second layer;

wherein the film has a moisture vapor transmission rate of 1.0 g/m$^2$/day or less at 100° F. and 90% relative humidity.

\* \* \* \* \*